United States Patent [19]
Fuchs et al.

[11] Patent Number: 5,740,101
[45] Date of Patent: Apr. 14, 1998

[54] TIME-STABLE LABELING OF INDIVIDUAL ATOMS OR GROUPS OF ATOMS IN THE SURFACE OF A SOLID, AND THE STORAGE OF INFORMATION UNITS IN THE ATOMIC RANGE

[75] Inventors: Harald Fuchs, Carlsberg; Thomas Schimmel, Hof; Harald Keller, Bad Durkheim, all of Germany

[73] Assignee: BASF Aktiengesellschaft, Ludwigshafen, Germany

[21] Appl. No.: 723,881

[22] Filed: Jul. 1, 1991

[30] Foreign Application Priority Data

Jul. 3, 1990 [DE] Germany .......................... 40 21 077.4

[51] Int. Cl.$^6$ .................................................. G11C 13/02
[52] U.S. Cl. ........................ 365/151; 365/114; 369/126; 250/306; 250/307
[58] Field of Search ................................... 365/151, 114; 369/126; 250/306, 307

[56] References Cited

U.S. PATENT DOCUMENTS

| 4,575,822 | 3/1986 | Quate | 365/151 |
|---|---|---|---|
| 4,907,195 | 3/1990 | Kazam et al. | 365/151 |
| 4,956,817 | 9/1990 | Wert et al. | 365/151 |
| 5,038,322 | 8/1991 | Van Loenen | 365/151 |

FOREIGN PATENT DOCUMENTS

| 0272935 | 6/1988 | European Pat. Off. |  |
|---|---|---|---|
| 0360337 | 3/1990 | United Kingdom | 365/151 |

OTHER PUBLICATIONS

Lithography with the Scanning Tunneling Microscope, McCord et al. J. Vac. Soci. Tech., 1986, B4, 86–88.

Silver et al., Direct Writin of Submicron Metallic . . . , Appl. Phys. Lett. 51 1987, 247–249.

Surface Modification in the Nanometer . . . , J. Vac. Sci. Tech. A6(2), Mar./Apr. 1986, 537–539.

Atomic-Scale Surface . . . , Nature vol. 325, 1987, 419–421, Becker et al.

Direct Writing in Si with a Scanning . . . , Van Loenen et al., Appl. Phys. Lett. 55 (1989), 1312–1314.

Scanning Tunneling Microscope . . . , Kuk et al, Rev. Sci. Instrum. 60(2) Feb. 1989, 165–180.

*Primary Examiner*—David C. Nelms
*Assistant Examiner*—Andrew Q. Tran
*Attorney, Agent, or Firm*—Keil & Weinkauf

[57] ABSTRACT

Abstract of the Disclosure: A process useful for information storage is described for the time-stable labeling of individual atoms or groups of atoms in the surface of a solid by locally removing individual atoms or group of atoms from the surface of a solid.

5 Claims, 2 Drawing Sheets

TIME-STABLE LABELING OF INDIVIDUAL ATOMS OR GROUPS OF ATOMS IN THE SURFACE OF A SOLID, AND THE STORAGE OF INFORMATION UNITS IN THE ATOMIC RANGE

The present invention relates to a process for the time-stable labeling of individual atoms or groups of atoms in the surface of a solid by means of a locally modified structural or electronic configuration, and the use of this process for information storage.

The storage of information, in particular image and data signals, currently takes place predominantly using magnetic or optical recording carriers. The information density which can be achieved using the latter is determined by the smallest information units which can be written and re-read by the process. In conventional magnetic storage media, these units are determined by the size of the magnetic domains (Weiβdomains), from a mechanical point of view by the head gap of the read/write heads used and by the distance of the read/write unit from the actual information carrier. In information carriers where the stored information is produced by a change in optical properties, the limit is the wavelength of the light used. The smallest information units here can thus not be smaller than about half the wavelength of the light. An increase in storage density in optical recording carriers of this type has in the meantime also been achieved through optical near-field microscopy, where the optical read unit is only a few nanometers above the information-carrying surface. The best information densities achieved here at present are in the order of about 20 nm.

A further increase in the information density is only possible by using near-field techniques with a resolution in the subnanometer range. Suitable methods for this purpose are scanning probe techniques, including the scanning tunneling microscope and the atomic force microscope. These methods allow imaging of surfaces on an atomic scale. It has therefore been proposed to produce information storage media having the highest possible density, namely in the range of the individual atoms or molecules. Success in developing these media would result in information densities in the terabyte/cm$^2$ range.

A number of proposals have been made for storing information in the nanometer range on inorganic or organic surfaces, including M.A. McCord et al., J. Vac. Sci. Technol. B4, (1986), 86–88, R.M. Silver et al., Appl. Phys. Lett. 51 (1987), 247–249 and U. Staufer et al., J. Vac. Sci. Technol. A6 (1988), 537–539. The deposition of individual atoms has also been reported (R.S. Becker et al., Nature 325 (1987), 415–421).

However, all the proposals disclosed hitherto for the provision of maximum-resolution information storage media which also have, in particular, long-term stability are unsatisfactory. Whereas organic storage media are, so far, incapable of producing line widths of <8 nm, inorganic systems, which can reproduce structures down to about 3 nm, are unable to retain them in a stable manner without an attendant change in the atomic order. In the case of the long-term stable structures in silicon which have previously been disclosed (Van Loenen et al., Appl. Phys. Lett. 55 (1989), 1312–1314), by contrast, the atomic structure is destroyed, ie. the atomic order is lost. A process of this type is therefore only suitable for producing non-erasable storage media in the nanometer range.

It is therefore an object of the present invention to provide a process for the time-stable labeling of atoms or groups of atoms which facilitates, in particular, time-stable storage of information without a structural change in the observed atomic environment of the modified area.

We have found that this object is achieved by a process for the time-stable labeling of atoms or groups of atoms in the surface of a solid comprising a chemical compound or a fully mixed alloy, which comprises selectively removing individual atoms or groups of atoms from the surface of the solid without essentially changing the observed atomic lattice structure of the atoms or groups of atoms which remain.

The process according to the invention can be carried out, in particular, by effecting the structural or electronic change in configuration in the surface of a semiconducting layered material by applying an external electrical or magnetic field for a limited time and over a limited area.

In the process according to the invention, the modification in configuration is particularly advantageously achieved by producing the local geometric or electronic reconfiguration by deliberately induced removal of atoms of one component of the chemical compound or alloy from the surface of the solid at predetermined locations.

The process according to the invention for stable labeling of individual atoms or groups of atoms can be particularly advantageously employed for storing information units. This provides a way of storing information in the atomic range and thus achieving a correspondingly high information density. However, the process according to the invention can be used not only for information storage, but also for erasing stored information. Thus, information units stored by the process according to the invention can be erased again by recombining the vacancies with doping atoms or groups of atoms which are present in the solid, thereby restoring the original state and thus erasing the information. For this purpose, the supply of thermal energy by heating the entire surface or by laser treatment of the entire surface or of points, or bombardment with appropriate doping atoms of the type previously removed is particularly suitable.

The process according to the invention is performed on from the surface of a solid, in particular a semiconducting layer, usually comprising a doped chalcogenide, eg. $WSe_2$. The atomic labeling is carried out in the surface of a layer of this type using a near-field technique, eg. by means of a needle-shaped electrode of a surface-sensitive scanning probe, for example a scanning tunneling microscope or a scanning atomic force microscope, by applying a short-duration electrical or magnetic field. Since the area of the maximum electrical field of a scanning probe of this type is preferably from 10 nm to 0.1 nm on the surface of the semiconducting layered material, the atomic or electronic structures on the surface can thus be affected directly. This local supply of energy causes one type of atom in the compound or alloy to be desorbed. An essential feature here is that the atomic coordination of the surrounding atoms is not disrupted and that the measures can be carried out under normal ambient conditions, ie., for example, in air and at room temperature.

The near-field technique used for writing the information can be a conventional scanning tunneling microscopy or atomic force microscopy process. The arrangement of these near-field techniques for characterizing surfaces is known and has been described (Y. Kuk et al., Rev. Sci. Instrum. 60(2) (1989), 165–180).

Figure 1:
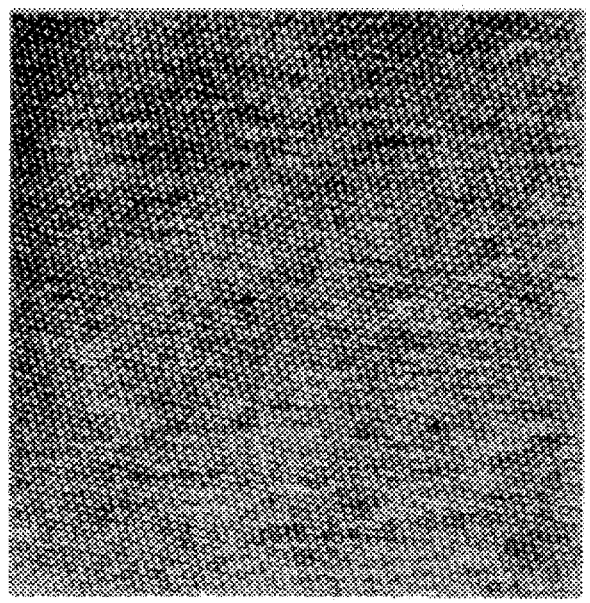
FIG. 1. This figure is an image of the surface of a tungsten diselenide sample before desorption of individual atoms or groups of atoms.
Figure 3:
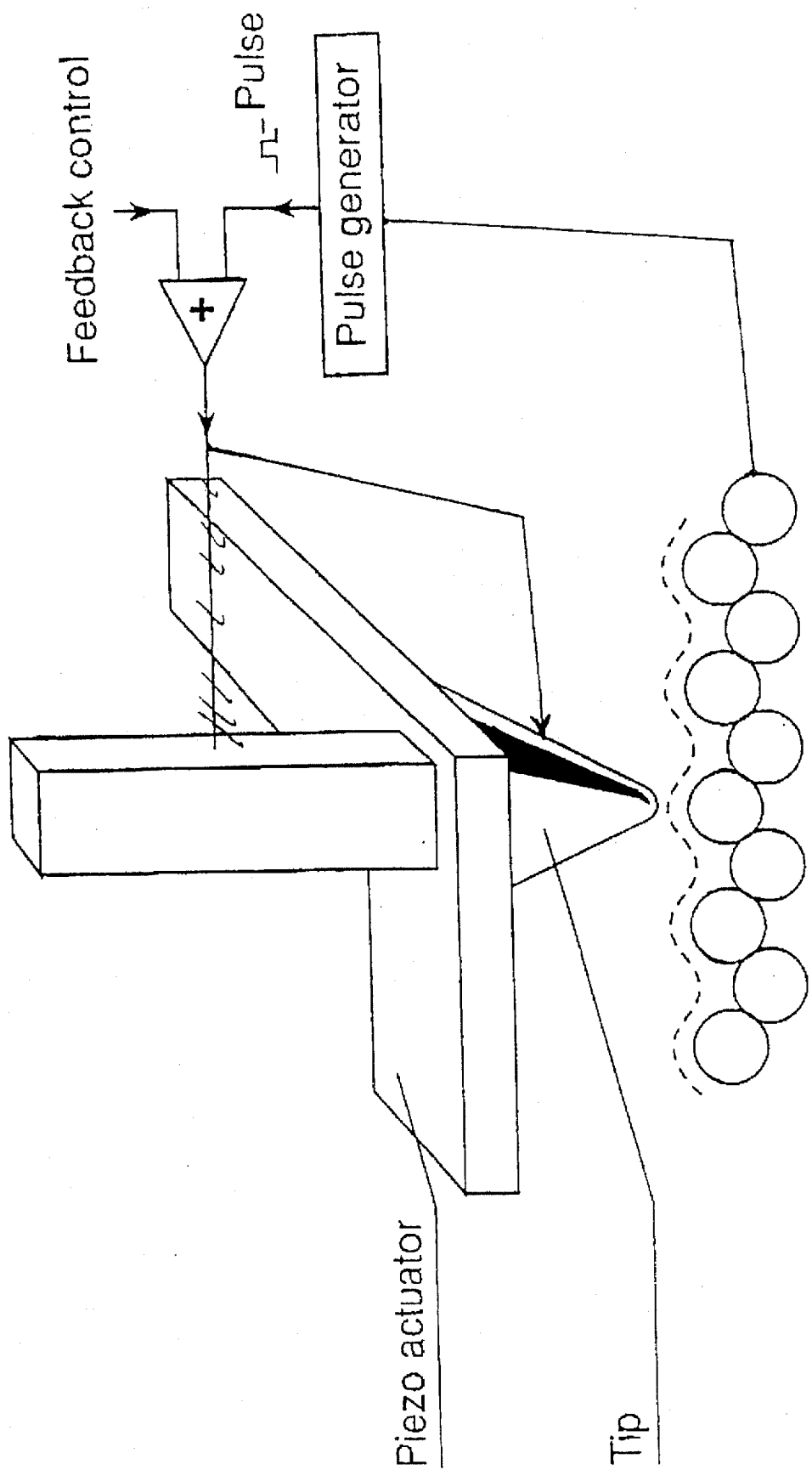
FIG. 3. This figure is a schematic representation of a scanning tunneling microscope and its use for nanometer structuring.

The process according to the invention (FIG. 3) is described in illustrative terms below:

The surface of a tungsten diselenide sample was first imaged at atomic resolution using a scanning tunneling microscope (STM)(FIG. 1) In the STM image only one type of atoms, ie. the tringsten atoms, is observed, while the other type, ie. the selenium atoms, cannot be seen. During the scan of the tunneling tip over the sample, voltage pulses having an amplitude of from 0.8 to 10 volts were then applied, superimposed on the tunneling voltage, for about 1 ms between the tunneling tip and the sample by means of a pulse generator. Subsequent scanning of the sample gives structures on the surface at atomic resolution with a lateral extension increasing with the level of the voltage pulses.

Figure 2:
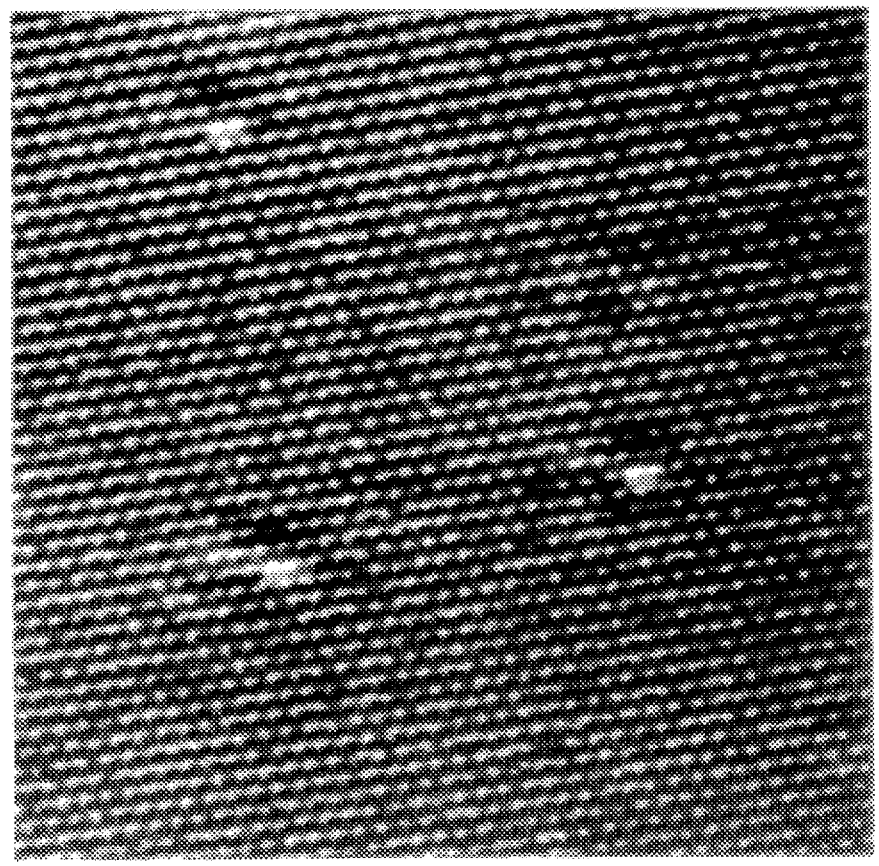
FIG. 2. This figure is an image of the surface of a tungsten diselenide sample after desorption of individual atoms or groups of atoms.

The effect of the desorption of individual atoms or groups of atoms is shown in FIG. 2. FIG. 2 (image size approximately 150×150 Å) shows the same surface immediately after application of approximately 1.5 volt pulses. Groups comprising three tungsten atoms were specifically modified here, showing an increase in the effective height due to the removal of a selenium atoms from between the three modified tungsten atoms, the relative position corresponding exactly to the positions of the tunneling tip at the time of the pulse. It was in this way possible to write patterns onto the sample; each voltage pulse labels, in a defined position, atoms for which the spatial or electronic configuration has been modified.

There was no problem in writing more than 100 structures using the same tip and subsequently imaging these at atomic resolution. There were normally no variations in imaging quality of the sample tip as a consequence of the pulsing.

Both writing and reading can be carried out under normal conditions, ie., in particular, without using an inert gas, vacuum or low temperatures.

In addition, it was also possible to show, by means of further experiments, that the use of a high or ultra-high vacuum has no observable effect on the writing or reading operation.

In order to test the stability of the labels with time, certain arrangements of labeled points, for example in triangles, in squares or as parallelograms, were written specifically, the resultant structures were imaged, and their relative positions to one another were recorded; the structures were found again after two days in unchanged shape and in the same arrangement. In particular, it was also possible to show that they are stable not only in vacuo or under an inert gas, but also in air.

For application as an information store, it is essential that the reading operation does not modify the stored information. To this end, both large and small structures (FIG. 2) on various tungsten diselenide samples were scanned using the STM over several hours, during which time they were imaged up to 500 times. In no case was a modification due to the imaging process (=reading process when used as a data carrier) observed.

For use as an information store, the functions reading, writing and erasing have thus been demonstrated and the processes used to achieve them have been indicated; for the structures generated in FIG. 2, a data density of about 10 terabytes/cm$^2$ is produced, exceeding the storage density of magnetic hard disks or magneto-optical disks by several orders of magnitude.

We claim:

1. A process for the time-stable labeling of individual atoms or groups of atoms in the surface of a solid comprising either a chemical compound or a fully mixed alloy by effecting either a structural or an electronic change in configuration in the surface of the solid, which process comprises, a) imaging the surface of said solid using a scanning tunneling microscope having a tunneling voltage and a tunneling tip, b) applying voltage pulses, superimposed on the tunneling voltage, between the tunneling tip and the surface of the solid, by means of a pulse generator, and c) labeling individual atoms or groups of atoms by selectively removing individual atoms or groups of atoms from the surface of the solid without essentially changing the atomic lattice structure of the atoms or groups of atoms which remain, wherein the type of atoms removed from the surface of the solid is different from the type of atoms which remain when observed with a surface-sensitive scanning probe, and observation of the atomic lattice structure shows the change in apparent height of the atoms neighboring the removed ones.

2. The process as defined in claim 1, wherein the change in configuration is achieved by applying an external electric field for a limited time and over a limited area.

3. The process as claimed in claim 2, wherein the field of limited duration and area is generated by the tunneling tip of a surface-sensitive scanning probe.

4. The process as claimed in claim 1 wherein the surface employed is a semiconducting layered material.

5. The process as defined in claim 1 for storing information units in the atomic range.

* * * * *